(12) United States Patent
Suzuki

(10) Patent No.: US 7,572,685 B2
(45) Date of Patent: Aug. 11, 2009

(54) METHOD OF MANUFACTURING THIN FILM TRANSISTOR

(75) Inventor: Koji Suzuki, Aichi (JP)

(73) Assignee: Sanyo Electric Co., Ltd. (JP)

( * ) Notice: Subject to any disclaimer, the term of this patent is extended or adjusted under 35 U.S.C. 154(b) by 378 days.

(21) Appl. No.: 11/411,058

(22) Filed: Apr. 25, 2006

(65) Prior Publication Data

US 2006/0186476 A1    Aug. 24, 2006

Related U.S. Application Data

(62) Division of application No. 09/527,534, filed on Mar. 16, 2000, now Pat. No. 7,087,963.

(30) Foreign Application Priority Data

Mar. 16, 1999    (JP) .................................. 11-70419

(51) Int. Cl.
*H01L 21/00*    (2006.01)
*H01L 21/84*    (2006.01)
(52) U.S. Cl. .................. 438/149; 438/151; 257/E21.31
(58) Field of Classification Search ......... 438/149–151, 438/216, 261, 287; 257/E21.32, E21.561, 257/E21.7, E21.704
See application file for complete search history.

(56) References Cited

U.S. PATENT DOCUMENTS

| | | | |
|---|---|---|---|
| 4,692,344 A | 9/1987 | Kaganowicz et al. | |
| 5,292,675 A | 3/1994 | Codama | |
| 5,296,729 A | 3/1994 | Yamanaka et al. | |
| 5,412,493 A | 5/1995 | Kunii et al. | |
| 5,440,168 A | 8/1995 | Nishimura et al. | |
| 5,719,065 A | 2/1998 | Takemura et al. | |
| 5,773,844 A | 6/1998 | Kawamura et al. | |
| 5,858,807 A | 1/1999 | Kawamura | |
| 5,917,225 A | 6/1999 | Yamazaki et al. | |
| 5,962,916 A | 10/1999 | Nakanishi et al. | |
| 5,998,838 A | 12/1999 | Tanabe et al. | |
| 6,096,585 A | 8/2000 | Fukuda et al. | |
| 6,118,151 A | 9/2000 | Tsutsu | |
| 6,124,153 A | 9/2000 | Lee et al. | |

(Continued)

FOREIGN PATENT DOCUMENTS

EP    0634797 A1    7/1994

(Continued)

OTHER PUBLICATIONS

English abstract for Japanese application No. JP 5-275701.

(Continued)

*Primary Examiner*—Hoai v Pham
(74) *Attorney, Agent, or Firm*—Cantor Colburn LLP

(57) ABSTRACT

On a glass substrate, an insulating protective layer comprising $SiO_2$ film is formed, and an active layer comprising a p-Si film is formed thereon. Further, a first gat insulating film comprising an SiN film which serves as a lower layer and a second gate insulating film comprising an SiN film which serves as an upper layer are stacked thereon. The second gate insulating layer is then removed by etching with a gate electrode formed thereon acting as a mask. Thus, ions can be doped only through the first gate insulating film to the p-Si film with a low acceleration energy.

5 Claims, 4 Drawing Sheets

U.S. PATENT DOCUMENTS

2002/0072158 A1  6/2002  Tanabe et al.

FOREIGN PATENT DOCUMENTS

| JP | 4-313241 | 11/1992 |
|---|---|---|
| JP | 10-242471 | 11/1992 |
| JP | 6-206165 | 8/1993 |
| JP | 5-275701 | 10/1993 |
| JP | 5-335578 | 12/1993 |
| JP | 6-163896 | 6/1994 |
| JP | 4-313241 | 9/1997 |
| JP | 9-252136 | 9/1997 |

OTHER PUBLICATIONS

English abstract for Japanese application No. JP 6-206165.
English abstract for Japanese application No. JP 5-3355578.
English abstract for Japanese application No. JP 9-252136.
English abstract for Japanese application No. JP 4-313241.
English abstract of Japanese application No. JP 4-313241.
English abstract of Japanese application No. JP 10-242471.
English abstract of Japanese application No. JP 6-163896.
Japanese Patent Laid-Out Publication No. Hei 5-335578 (Dec. 17, 1993).
Stanley Wolf, Ph.D. et al., Silicon Processing for the VLSI Era, vol. 1, pp. 521-522.

METHOD OF MANUFACTURING THIN FILM TRANSISTOR

CROSS-REFERENCE TO RELATED APPLICATION

This application is a divisional application of U.S. patent application Ser. No. 09/527,534, filed on Mar. 16, 2000, now U.S. Pat. No. 7,087,963, which is herein incorporated by reference in its entirety.

BACKGROUND OF THE INVENTION

1. Field of the Invention

The present invention relates to a method of manufacturing a thin film transistor.

2. Description of Related Art

Thin film transistors (hereinafter referred to as a "TFT" or "TFTs") employing, as an active layer, a p-Si film formed on a transparent insulating substrate are being developed as pixel drive elements in active matrix type LCDs (Liquid Crystal Displays).

Poly-silicon thin film transistors (hereinafter referred to as "p-Si TFTS") are more advantageous than amorphous silicon thin film transistors (hereinafeter referred to as "a-Si TFTs") because they have a larger mobility and a higher driving ability. Therefore, the p-Si TFTs allow implementation of LCDs with high performance, in which, along with pixel portions, peripheral driving circuits can also be integrated on the same substrate.

In a p-Si TFT, so as to form source and drain regions in the p-Si film functioning as an active layer, the p-Si film is subjected to ion doping followed by a thermal processing for activation.

A method of manufacturing a TFT according to a related art will be described. FIG. 1 is a cross section of a TFT fabricated by a TFT manufacturing method according to a related art.

Referring to FIG. 1, a first gate insulating film 13 comprising an $SiO_2$ film and a second gate insulating film 14 comprising an SiN film disposed thereon are formed over the entire surface of a substrate 10 so as to include a p-Si film 12.

In FIGS. 2A to 2D, cross sections of a TFT are depicted to illustrate the TFT manufacturing process steps according to the related art.

Step 1 (FIG. 2A):

On an insulating substrate 10 comprising a quartz glass, non-alkali glass or the like, an $SiO_2$ film 11 serving as an insulating protective film is formed by the plasma CVD method, and an a-Si film 12 is formed on the $SiO_2$ film 11 using plasma CVD method. Then, the a-Si film 12 is subjected to annealing by scanning to irradiate the surface thereof with an excimer laser such that the a-Si film 12 is molten and recrystallized to a p-Si film 12, which is then etched into an island shape functioning as an active layer.

Step 2 (FIG. 2B):

The first gate insulating film 13 comprising an $SiO_2$ film and the second gate insulating film 14 comprising an SiN film are stacked over the entire surface of the p-Si film 12 by the CVD method. A conductive material comprising a refractory metal such as chromium (Cr) or molybdenum (Mo) is then deposited on the SiN film 14 using a sputtering method so as to form a gate electrode 15 such that it superposes the semiconductor film 12 using photolithography and dry etching by the RIE method.

Thereafter, P- or N-type impurity ions 16 corresponding to the type of a transistor to be formed are doped into the p-Si film 12 except the region covered with the gate electrode 15 through the first and second gate insulating films 13 and 14, with the gate electrode 15 acting as a mask. This ion doping creates an intrinsic or substantially intrinsic region of the p-Si film 12 beneath the gate electrode 15.

Step 3 (FIG. 2C):

A resist 17 having a smaller width than the p-Si film 12 is formed so as to cover the gate electrode 15 and the second insulating film 14. Then, impurity ions 18 are doped into the p-Si film 12 to form LDD (Lightly Doped Drain) regions 12LD having a low density of doped ions, source 12s and drain 12d having a high density of doped ions.

Thus, in the p-Si film 12, a region located right beneath the gate electrode 15 corresponds to a channel 12c, whereas regions located on both sides of the gate electrode 15 correspond to the source 12s and the drain 12d, respectively.

Step 4 (FIG. 2D):

subsequent to removal of the resist 17, an SiN film 19 and an $SiO_2$ film 20 are sequentially stacked on the entire surface of the substrate 10 including the p-Si film 12 by the plasma CVD method, to form an interlayer insulating film comprising two films, namely the SiN film 19 and the $SiO_2$ film 20.

After forming the SiN film 19 and the $SiO_2$ film 20, first contact holes 30 are formed through the interlayer insulating film at positions corresponding to the source 12s and the drain 12d, respectively, so as to reach the p-Si film 12. Then, a source electrode 21 and a drain electrode 22 comprising aluminum or the like are formed in these first contact holes 30, respectively. Further, a planarization layer 23 comprising an organic resin or the like is deposited over these electrodes. Another contact hole 32 is then formed at a position of the planarization layer 23 corresponding to the source electrode 21, into which an ITO, a transparent electrode material, is deposited and patterned to form a pixel electrode 24.

While the TFT employing a p-Si film is advantageous due to its high mobility or the like as already described, the p-Si film has many crystalline defects at the grain boundaries and therefore electrons moving in the film tend to be easily trapped. It is particularly undesirable to have such crystalline defects in the channel region in a TFT. Therefore, it has been proposed that hydrogen be introduced in the film so as to terminate dangling bonds existing in these defects. In order to introduce hydrogen into the film, a method is known in which an SiN film containing a great number of hydrogen atoms is heated together with the p-Si film such that the hydrogen ions are transferred from the SiN film to the p-Si film. In this case, it is preferable that the SiN film and the p-Si film be located as close to each other as possible so as to supply the hydrogen (H) atoms in the SiN film to the p-Si film by heating. However, if the p-Si film and the SiN film are directly in contact with each other, the threshold values of the TFT employing such p-Si film vary due to predetermined charges generated in the SiN film. For this reason, in the above-mentioned top-gate type TFT, the SiN film 14 cannot be provided, as a gate insulating film, directly on the p-Si film 12, but the SiN film 14 must be formed on the $SiO_2$ film 13 disposed on the p-Si film 12, resulting in a structure employing two gate insulating films, as shown in FIGS. 1, and 2A to 2D.

However, in a case where the gate insulating films comprise a sequence of two layers, namely the $SiO_2$ film 13 and the SiN film 14 in the above-mentioned top-gate type TFT, the acceleration energy must be increased when doping ions into the semiconductor film so as to reach the p-Si film 12 through these two-layered gate insulating films. For example, phosphorus (P) ions must be doped with an acceleration energy of 100 keV or more. This may increase the power consumption of a doping apparatus.

Further, when the acceleration energy is increased for ion doping, the temperature of the substrate rises to as high as approximately 200° C. Such a high temperature deteriorates the resist 17 covering the gate electrode 15 and the LDD regions, which results in distortion in the periphery of the resist or makes the resist 17 difficult to peel off when removing it after ion doping.

SUMMARY OF THE INVENTION

The present invention is made in view of the foregoing problems of the related art, and aims to provide a method of manufacturing a thin film transistor capable of suppressing a temperature rise in a substrate at the time of ion doping with high acceleration energy.

In accordance with one aspect of the present invention, there is provided a method of manufacturing a thin film transistor comprising the steps of forming a semiconductor film on one major surface of a substrate; forming a first gate insulating film and a second gate insulating film sequentially in this order on said semiconductor film; forming a gate electrode on said second gate insulating film; removing a part or all of said second gate insulating film except a region covered by said gate electrode; and, after removing said second gate insulating film, doping ions in said semiconductor film with said gate electrode acting as a doping mask.

In another aspect of the present invention, there is provided a thin film transistor comprising a semiconductor film, a first gate insulating film, a second gate insulating film, and a gate electrode sequentially formed on one major surface of a substrate in that order, wherein said first gate insulating film covers said semiconductor film, and said second gate insulating film is formed by a material for supplying hydrogen to said semiconductor film only in a region covered by said gate electrode to have substantially the same shape as said gate electrode.

In another aspect of the present invention, there is provided a thin film transistor comprising a semiconductor film, a first gate insulating film, a second gate insulating film, and a gate electrode sequentially formed in that order on one major surface of a substrate, wherein said first gate insulating film covers said semiconductor film, and said second gate insulating film is formed by a material for supplying hydrogen to said semiconductor film and has a smaller film thickness in a region not covered with said gate electrode than that in a region covered by said gate electrode.

In still another aspect of the present invention, in said thin film transistor or said method of manufacturing the same, said first gate insulating film is a silicon oxide film and said second gate insulating film is a silicon nitride film.

In still another aspect of the present invention, said second gate insulating film is a supply source for supplying hydrogen to said semiconductor film, and hydrogen contained in said second gate insulating film can be introduced into said semiconductor film by a predetermined annealing process.

In yet another aspect of the present invention, said semiconductor film is a poly-silicon film.

In still another aspect of the present invention, after said gate electrode is formed in a predetermined pattern, said second gate insulating film is removed by etching with said gate electrode acting as a mask.

According to the TFT manufacturing method of the present invention, only the ion acceleration energy through the first gate insulating film or the second gate insulating film having a decreased thickness is required when ions are doped so as to form the source and the drain, thereby suppressing the temperature of the substrate which rises in proportion to the acceleration energy.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

Figure 1:
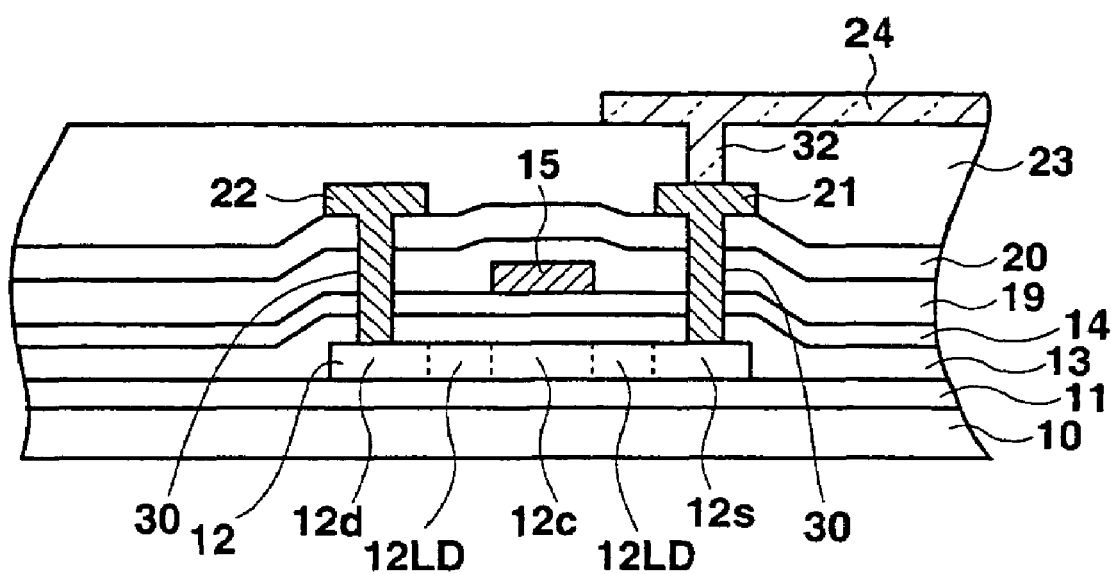
FIG. 1 is a cross section of a TFT manufactured by a TFT manufacturing method according to a related art.
Figure 2A:
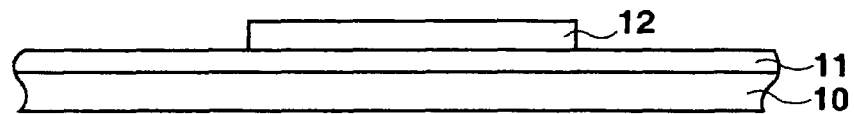
FIGS. 2A, 2B, 2C, and 2D are cross sections of a TFT for explaining the manufacturing process steps of a related art.
Figure 2B:
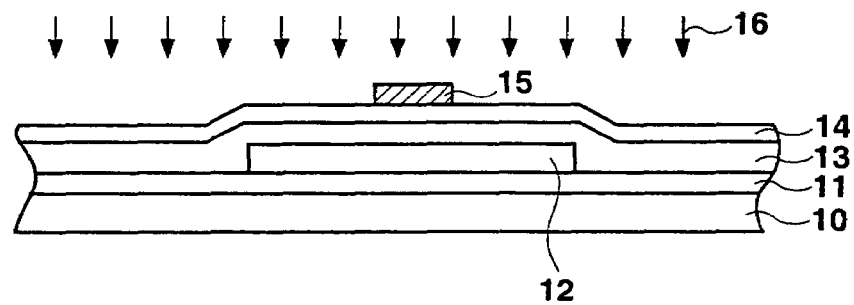
Figure 2C:
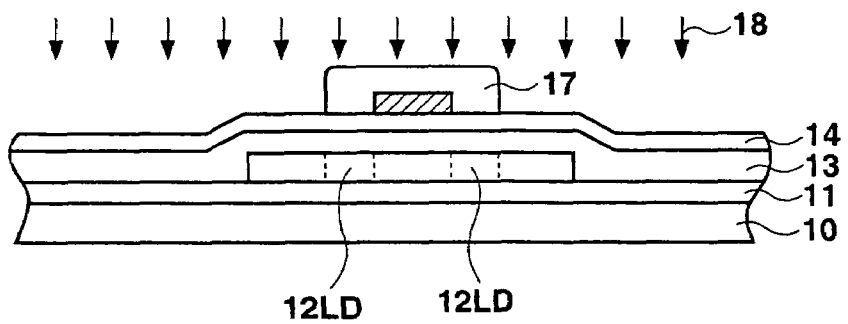
Figure 2D:
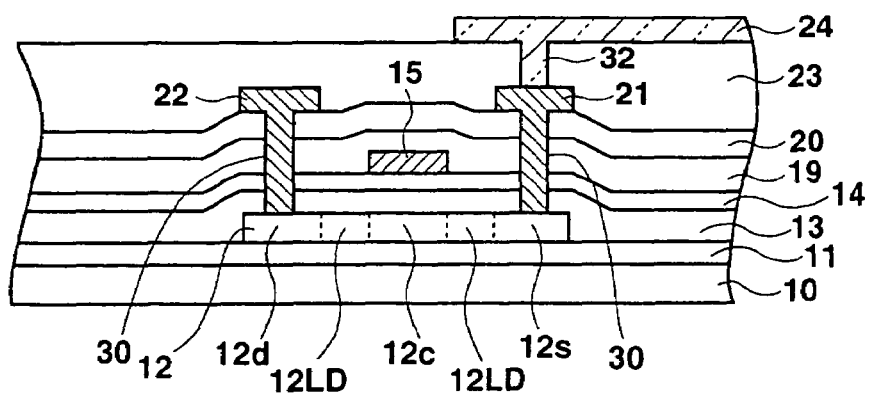
Figure 3:
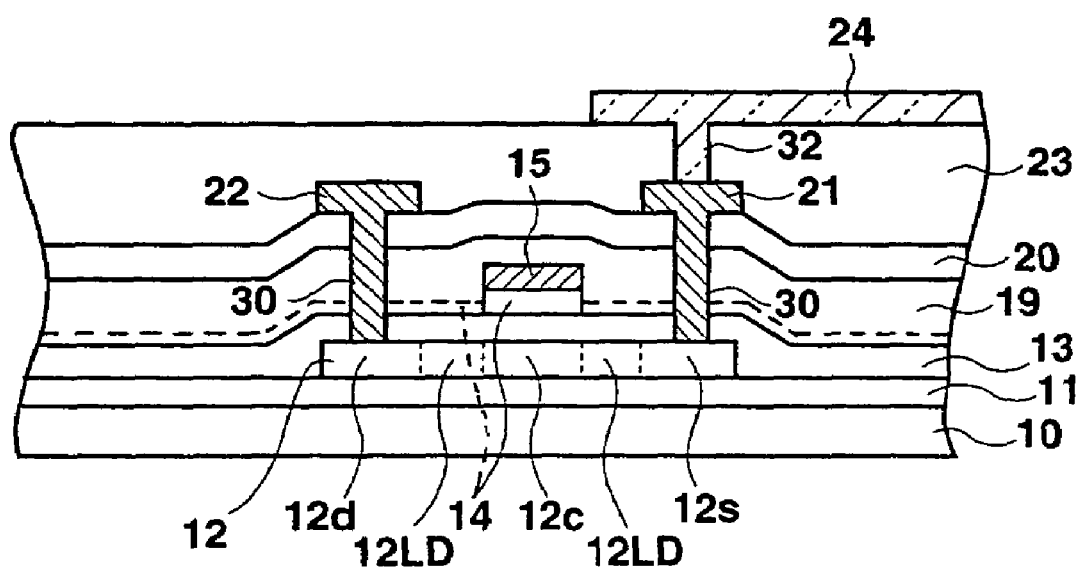
FIG. 3 is a cross section of a TFT manufactured by a TFT manufacturing method according to the present invention.
Figure 4A:
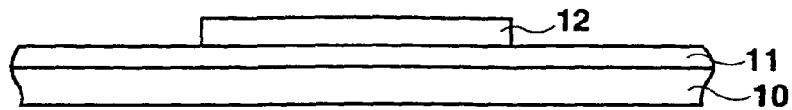
FIGS. 4A, 4B, 4C, 4D and 4E are cross sections of a TFT for explaining the manufacturing process steps of the present invention.
Figure 4B:
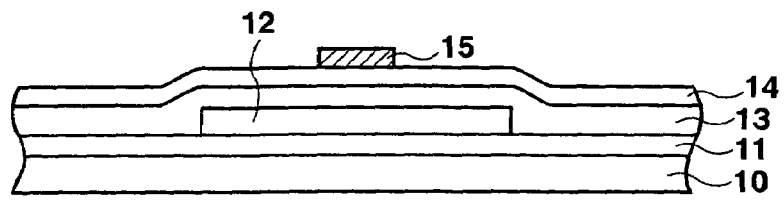
Figure 4C:
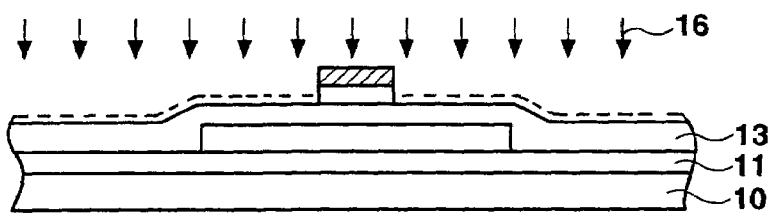
Figure 4D:
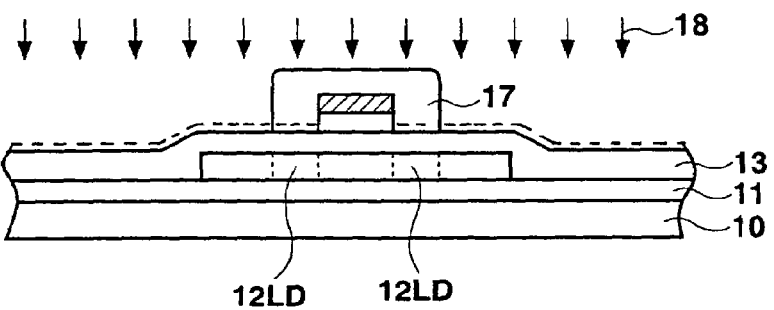
Figure 4E:
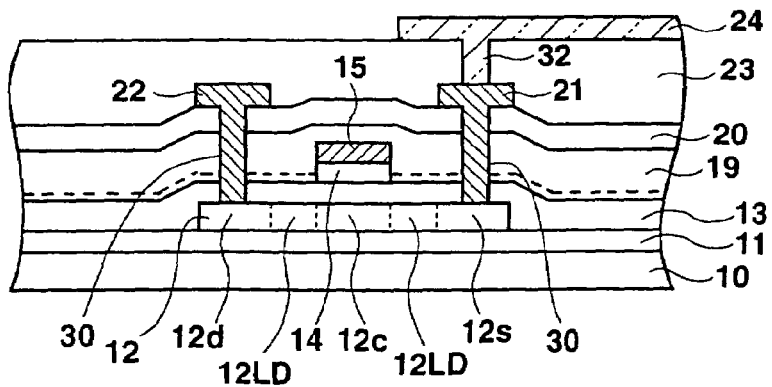

A preferred embodiment of the present invention, being a method of manufacturing a TFT according to the present invention, will be described in further detail with reference to the accompanying drawings. FIG. 3 is a cross section of a TFT manufactured in accordance with the present invention.

Referring to FIG. 3, a TFT manufactured in accordance with the present invention is differs from a TFT manufactured using the related art method described earlier in that the second gate insulating film 14 comprising an SiN film is etched using the gate electrode 15 as a mask such that this film 14 is not formed except on the region corresponding to the gate electrode 15.

The TFT manufacturing process steps of the present invention will be described with reference to the cross sections shown in FIGS. 4A to 4E.

Step 1 (FIG. 4A):

On an insulating substrate 10 comprising a quartz glass, non-alkali glass, or the like, an $SiO_2$ film 11 serving as an insulating protective film is formed by the plasma CVD method, and an a-Si film 12 is formed on the $SiO_2$ film 11 using a plasma CVD method. Then, the a-Si film 12 is subjected to annealing by scanning to irradiate the surface thereof with an excimer laser [XeCl] beam such that the a-Si film 12 is molten and recrystallized to a p-Si film 12, which is then etched into an island shape functioning as an active layer of a p-Si TFT.

Step 2 (FIG. 4B):

A first gate insulating film 13 comprising an $SiO_2$ film and a second gate insulating film 14 comprising an SiN film are formed over the entire surface of the p-Si film 12 by the CVD method. A conductive material comprising a refractory metal such as Cr or Mo is deposited on the second gate insulating film 14 by sputtering using photolithography and dry etching by the RIE method so as to form a gate electrode 15 such that it superposes the semiconductor film 12. While the gate electrode 15 is formed, a gate signal line (not shown) connected to the gate electrode 15 for supplying gate signals is simultaneously formed.

Step 3 (FIG. 4C):

The second gate insulating film 14 is removed by etching with the gate electrode 15 acting as a mask such that the second gate insulating film 14 is left on the region beneath the gate electrode 15. Then, P- or N-type impurity ions 16 corresponding to the type of a transistor to be formed are doped into the p-Si film 12 except the region covered with the gate electrode 15 and the second gate insulating film 14. Thus, (the region of) the p-Si film 12 disposed beneath the gate electrode 15 becomes intrinsic or substantially intrinsic, into which no impurity ions are doped.

Step 4 (FIG. 4D):

A resist 17 having a smaller width than the p-Si film 12 is formed so as to cover the gate electrode 15 and the second insulating film 14. Then, impurity ions 18 are doped into the p-Si film 12 with the resist 17 acting as a mask, to form LDD (Lightly Doped Drain) regions 12LD having a low density of doped ions, and source 12s and drain 12d having a high density of doped ions.

At this point, heating is applied to activate doped impurities and cause hydrogen atoms contained in the SiN film, that is the second gate insulating film 14, to be introduced into the p-Si film 12 for hydrogenation.

As a result of the aforementioned process, in the p-Si film 12, the region located beneath the gate electrode 15 corresponds to a channel 12c, and the regions located on both sides of the gate electrode 15 correspond to the source 12s and the drain 12d, respectively.

It should be noted that P-type ions such as boron (B) are doped for forming a P-channel type TFT whereas N-type ions such as phosphorus (P) are doped for forming an N-channel type TFT.

Step 5 (FIG. 4E):

subsequent to removal of the resist 17, an SiN film 19 and an $SiO_2$ film 20 are sequentially stacked on the entire surface of the substrate 10 including the p-Si film 12 by a plasma CVD method, to constitute an interlayer insulating film comprising two layers, namely the SiN film 19 and the $SiO_2$ film 20.

After forming the SiN film 19 and the $SiO_2$ film 20, first contact holes 30 are formed through the interlayer insulating film at positions corresponding to the source 12s and the drain 12d, respectively, so as to reach the p-Si film 12. Then, a source electrode 21 and a drain electrode 22 comprising aluminum or the like are formed in these first contact holes 30, respectively. Then, a planarization layer 23 comprising an organic resin or the like is deposited on these electrodes. Another contact hole 32 is then formed at a position of the planarization layer 23 corresponding to the source electrode 21, into which an ITO, a transparent electrode material, is deposited and patterned to form a pixel electrode 24. By the foregoing processes, a p-Si TFT semiconductor element is formed.

As described above, the first gate insulating film 13 comprising an $SiO_2$ film, which serves as a lower layer, and the second gate insulating film 14 comprising an SiN film, which serves as an upper layer, are stacked and thereafter the second gate insulating film 14 is removed by etching with the gate electrode 15 as a mask. Therefore, it is sufficient to dope ions through only the first gate insulating film 13, which allows ions to be sufficiently doped in the p-Si film 12 with only a low acceleration energy.

Also, when forming the LDD regions, ions can be doped with such an acceleration energy that does not cause deterioration of the resist covering the LDD regions Thus, power consumption of the ion doping apparatus can be suppressed and also deterioration of the resist at the time of ion doping can be prevented.

In order to improve the TFT characteristics, hydrogen atoms contained in the SiN film are supplied to the p-Si film by heating, as described above. In this case, it is suffice to supply hydrogen atoms to at least the channel of the p-Si film, for the following reason. Namely, in the LLD regions (12LDs) as well as in the source and the drain (12s, 12d), the influence of dangling bonds in the p-Si film on the conductivity of the film is small because impurities are doped to these regions. To the contrary, the channel region of the p-Si film, which is intrinsic, will suffer great disadvantage in the operation characteristics of the TFT unless dangling bonds are terminated in this region of the film. According to the present invention, it is possible to effectively supply hydrogen atoms to the channel region due to the SiN film which is formed to be left only beneath the gate electrode.

Although the foregoing embodiment describes a case where an a-Si film is irradiated with a laser to obtain a p-Si film which functions as an active layer, a similar advantage can be achieved when a p-Si film is directly formed on an insulating protective film using a CVD method or the like.

The insulating protective film is provided so as to block sodium ions or the like from intruding into the p-Si film if a glass or the like is employed as a substrate 10. Therefore, the insulating protective film is not necessary when a substrate causing no such impurity intrusion is employed. However, the insulating protective film is necessary when the substrate is not an insulating substrate.

Further, in the foregoing embodiment, the source electrode 21 is formed by filling the contact hole 30 provided corresponding to the source 12s with Al, and the pixel electrode 24 comprising ITO is further formed so as to make contact with the source electrode 21. However, the present invention is not limited to that example, and it is also possible to fill the contact hole 30 with an ITO to form the pixel electrode 24 directly in contact with the source 12s.

Although the foregoing embodiment describes an advantage of preventing deterioration of the resist for forming the LDD regions, the following advantage can be also achieved. Namely, in a TFT including an N-channel type TFT and a P-type channel TFT on the same substrate, a resist is provided for one channel type TFT so as to prevent ions of the other channel type from being doped thereto when ions of the other type are doped. In such a case, it is possible to ensure that the resist will not be difficult to peel off after ion doping is completed.

Further, although the second gate insulating film 14 is removed such that the second gate insulating film 14 is etched to have substantially the same shape as the gate electrode 15 in the foregoing example, the second gate insulating film 14 may be etched such that a desired thickness is left in certain regions of the second gate insulating film 14 other than the region corresponding to the gate electrode 15, as shown by a dot line in FIGS. 3, 4C, 4D, and 4E. In other words, in the second gate insulating film 14, the thickness of the regions excluding the region corresponding to the gate electrode 15 may be smaller than the thickness of the region corresponding to the gate electrode 15. For example, when the thickness of the second gate insulating film 14 prior to etching is 400 Å, the thickness of the second gate insulating film 14 in the regions other than the region corresponding to the gate electrode 15 is reduced, by etching, to 100 to 200 Å (approximately 150 Å in the average). This results in the second gate insulating film 14 having a thickness of 400 Å in the region corresponding to the gate electrode 15 and a thickness of 200 to 150 Å in the remaining region. Specifically, a certain thickness which does not block ion doping into the source and drain regions will suffice. With an SiN film of such a thickness covering an entire semiconductor layer, sufficient ion doping can be achieved while preventing intrusion of impurities or the like, to thereby improve reliability of the TFT.

While the preferred embodiment of the present invention has been described using specific terms, such description is for illustrative purposes only, and it is to be understood that changes and variations may be made without departing from the spirit or scope of the appended claims.

What is claimed is:

1. A method of manufacturing a thin film transistor comprising the steps of:
   forming a semiconductor film on one major surface of a substrate;
   forming a first gate insulating film and a second gate insulating film sequentially in this order on said semiconductor film, wherein said first gate insulating film is a silicon oxide film and said second gate insulating film is a silicon nitride film;
   forming a gate electrode on said second gate insulating film;
   removing a part of said second gate insulating film except a region covered by said gate electrode such that a thickness of the second gate insulating film is reduced; and
   after removing said second gate insulating film, doping ions into said semiconductor film, via said second gate insulating film having a reduced thickness and the first gate insulating film, with said gate electrode acting as a doping mask.

2. The method according to claim 1, wherein said second gate insulating film is a supply source for supplying hydrogen to said semiconductor film.

3. The method according to claim 2, wherein hydrogen contained in said second gate insulating film is introduced into said semiconductor film by a predetermined annealing process.

4. The method according to claim 2, wherein said semiconductor film is a poly-silicon film.

5. The method according to claim 1, wherein after said gate electrode is formed in a predetermined pattern, said second gate insulating film is removed by etching with said gate electrode acting as a mask.

* * * * *

UNITED STATES PATENT AND TRADEMARK OFFICE
CERTIFICATE OF CORRECTION

PATENT NO. : 7,572,685 B2  Page 1 of 1
APPLICATION NO. : 11/411058
DATED : August 11, 2009
INVENTOR(S) : Koji Suzuki It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 486 days.

Signed and Sealed this

Fourteenth Day of December, 2010

David J. Kappos
*Director of the United States Patent and Trademark Office*